United States Patent [19]

Rowlette

[11] Patent Number: 4,770,641

[45] Date of Patent: Sep. 13, 1988

[54] CONDUCTIVE GEL INTERCONNECTION APPARATUS

[75] Inventor: John R. Rowlette, Clemmons, N.C.

[73] Assignee: AMP Incorporated, Harrisburg, Pa.

[21] Appl. No.: 846,425

[22] Filed: Mar. 31, 1986

[51] Int. Cl.⁴ ............................................. H01R 9/09
[52] U.S. Cl. ...................................... 439/86; 439/178
[58] Field of Search ........... 339/116 R, 116 C, 114 R, 339/115 M, DIG. 3; 439/86, 90, 91, 178

[56] References Cited

U.S. PATENT DOCUMENTS

| | | | |
|---|---|---|---|
| 3,157,813 | 11/1964 | Bowser et al. | 339/118 R |
| 3,503,034 | 3/1970 | Appleton | 339/118 R |
| 4,027,936 | 6/1977 | Nemoto et al. | 339/DIG. 3 |
| 4,421,370 | 12/1983 | Treakle et al. | 339/DIG. 3 |

*Primary Examiner*—Joseph H. McGlynn
*Attorney, Agent, or Firm*—Robert W. Pitts

[57] ABSTRACT

A conductive gel interconnection apparatus forming either a permanent or disconnectable electrical interconnection between multiple components is disclosed. Conductive particles are dispersed within a dielectric gelatinous medium and a concentration exceeding the percolation threshold to impart conductivity to the gel. Discrete electrical components or a plurality of components located on a substrate, such as a printed circuit board, can be interconnected by positioning the components in registration with the conductive gel located in cavities within an insulative body. The conductive gel forms a coherent mass and does not adhere to the electrical components upon withdrawal.

9 Claims, 7 Drawing Sheets

CONDUCTIVE GEL

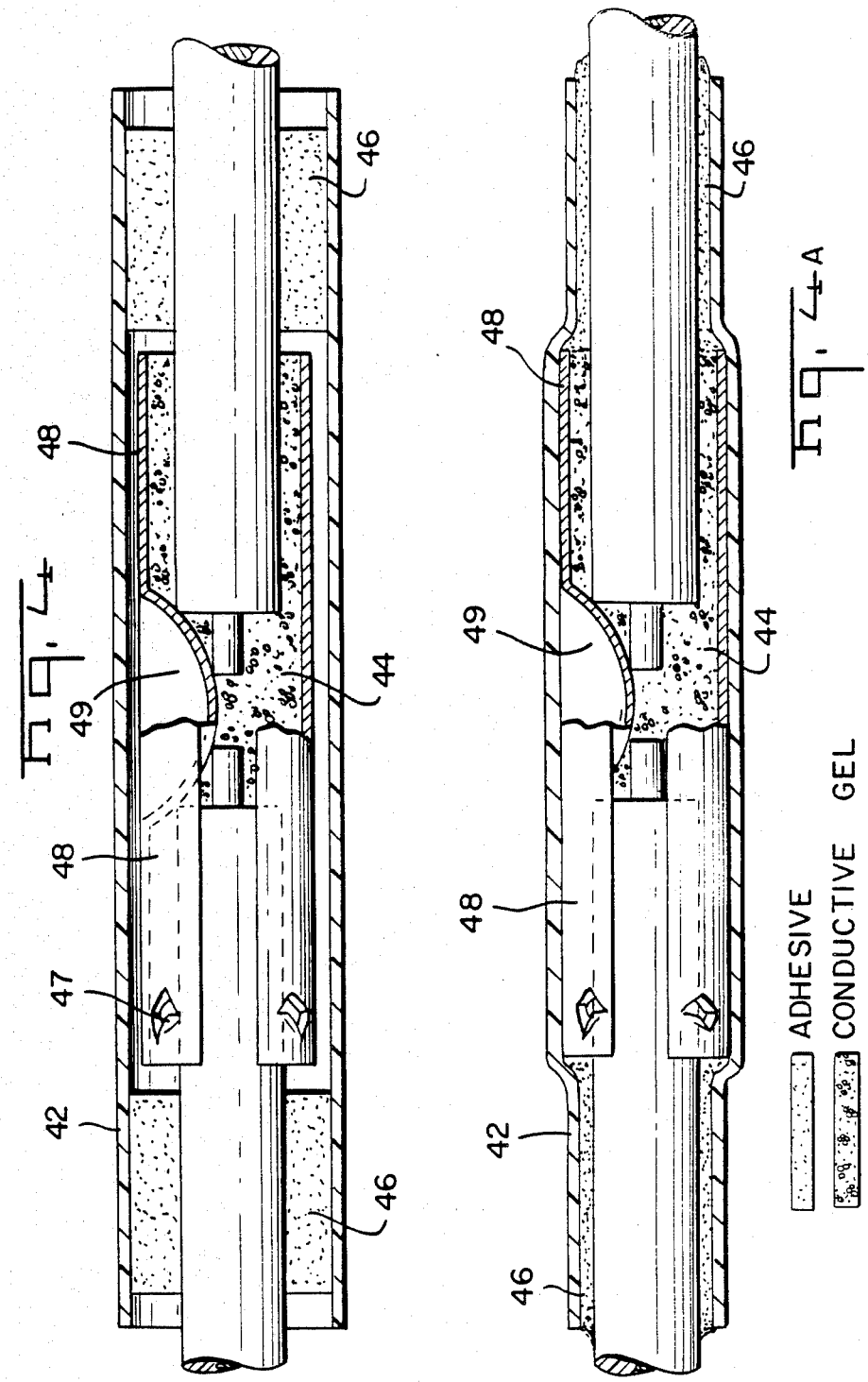

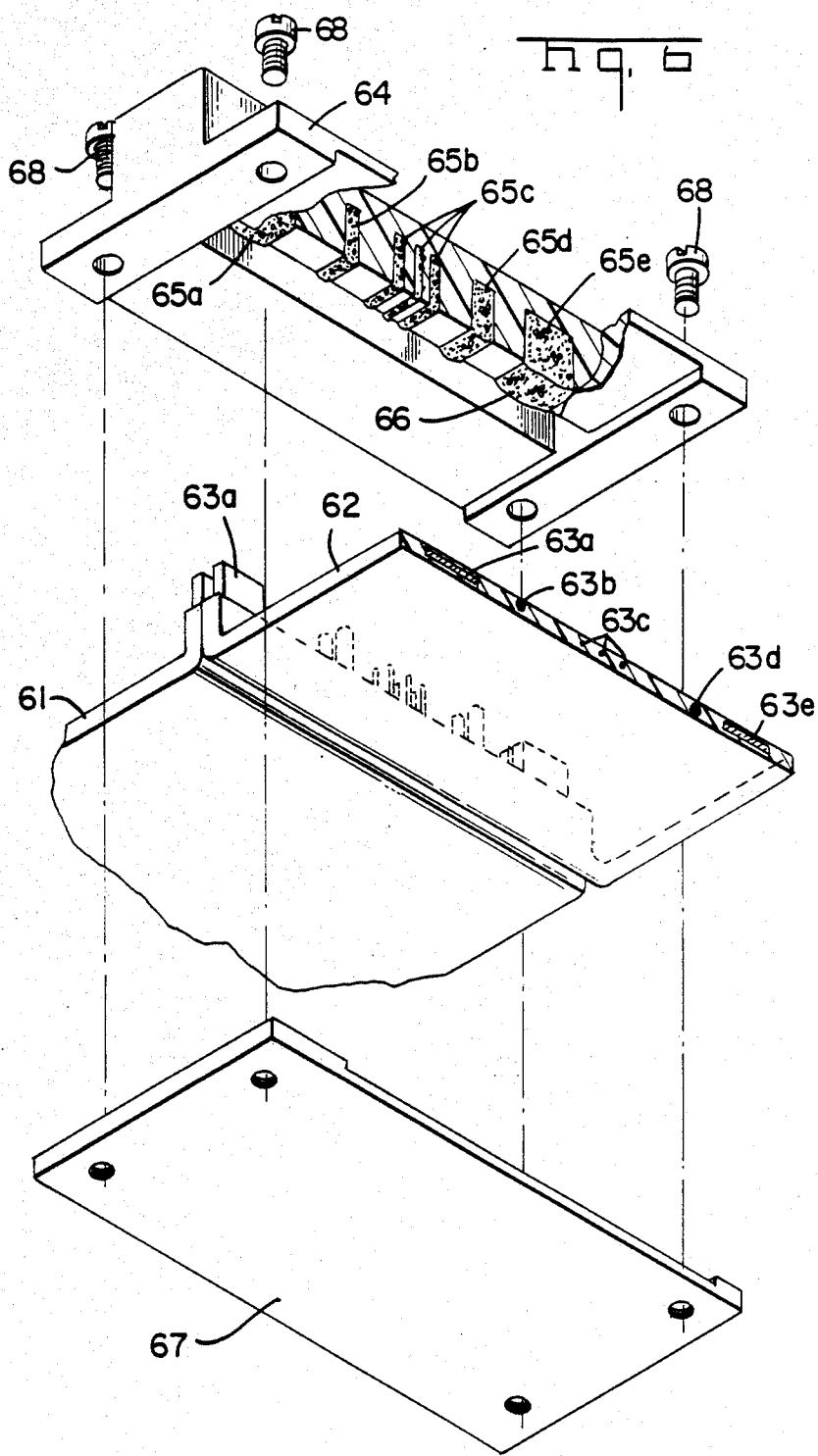

☐ NONCONDUCTIVE GEL
▓ CONDUCTIVE GEL

CONDUCTIVE GEL INTERCONNECTION APPARATUS

BACKGROUND OF THE INVENTION

1. Field of the Invention

This invention relates to the interconnection of a plurality of electrical conductors such as discrete insulated wires, printed circuit board traces, or conductors on a flat panel display. More specifically, this invention relates to the use of a conductive gel for establishing the interconnection.

2. Description of the Prior Art

Polymeric electrically conductive materials, such as conductive epoxies and thermoplastic adhesives, have been used, though perhaps not extensively, to establish interconnections for electrical circuitry. For example, conductive epoxies have been employed to mount electrical components on printed circuit boards. Polymeric electrically conductive adhesives have also been employed in tape form to interconnect conductors on a substrate with other components or circuitry. When used to establish such electrical interconnections, these conductive epoxies and conductive adhesives can be deposited on a surface in a conventional manner, such as by screen printing. Then upon the application of heat and pressure or upon the application of pressure, depending upon the precise character of the conductive adhesive, both electrical and structural or mechanical integrity can be established between separate conductors. These conductive epoxies can be formulated to harden to form a techanical connection, or they can have a tacky, putty-like consistency when cured. Although conductors can be removed from the putty-like material, the tacky material will adhere to the conductors upon removal.

These polymeric interconnection systems generally are intended to replace such conventional interconnections as soldered interconnections. However, these polymeric electrically conductive materials generally form permanent bonds between the conductors in somewhat the same manner as with the use of solder. Although polymeric conductive materials, unlike solder, do permit initial checking for electrical integrity prior to establishment of the final soldered interconnection, in use such conductive polymers establish a permanent interconnection between associated conductors.

The instant invention has many of the same application advantages as conductive epoxies and thermoplastic adhesives. However, the conductive gel employed herein is especially adapted to the formation of a disconnectable electrical connection. Such a disconnectable electrical connection would not properly be characterized as a temporary connection since a suitable connection could be established during the operational life of a particular device. A disconnectable connector of this sort, however, would permit disassembly of the components, reconfiguration of an electrical apparatus in which the disconnectable connector was employed, and repair or replacement of the individual components.

SUMMARY OF THE INVENTION

This invention relates to a conductive gel and to electrical connector apparatus suitable for use with the conductive gel. Such connector apparatus can be used to establish electrical interconnection between plurality of associated conductors, such as wires, traces on a printed circuit board, flat conductors, traces on a flat panel display, a pin grid array, or other conventional discrete components or closely spaced conductors positioned in an array on a substrate.

A connector apparatus in accordance with this invention would employ an insulative body having one or more open-ended cavities. Each cavity would contain a conductive gel for establishing electrical interconnection between two discrete electrical elements. When using a bulk conductive gel, each cavity would be aligned with a separate pair of conductive elements. An anisotropic conductive gel would permit a plurality of interconnections through the same cavity. A cavity could be open on both sides of the housing, in which case the conductors would be attached to opposite sides of the housing. The cavity could also open onto only one face of the housing, thus permitting two conductors to be positioned along the same face. The housing could comprise a rigid housing of insulative materials such as a thermoplastic, a relatively soft durometer housing, or it could comprise an outer dielectric sleeve formed of a flexible film. The conductors would be secured to the housing in alignment with the open-ended cavities by conventional means such as mechanical hold down devices or structural adhesives. It should be understood, of course, that the apparatus for securing the conductors to the housings is preferably disconnectable, if the full capabilities of the conductive gel are to be realized in the connector apparatus.

The conductive gel employed herein comprises a polymeric conductor system in which a plurality of conductive particles are dispersed within an insulative gel-like medium. The conductive gel possesses a memory and is conformable to the cavity prior to interconnection of the associated conductors. The gel is not in a liquid state and is sufficiently coherent and viscous that it will not flow from the cavity means under the influence of gravity. The gel will also conform to the interface between the housing cavity and the conductors upon interconnection. Upon disconnection, however, the gel will return substantially to its original shape and remain within the housing cavities. The gel will not adhere to the conductors upon disconnection.

BRIEF DESCRIPTION OF THE DRAWINGS

FIG. 1A is a view of the assembled configuration of the connector shown in FIG. 1.

FIG. 3 is a view showing a connector in accordance with the principles of this invention for interconnecting a pin grid array to printed circuit boards. FIG. 3A is a view of the assembled configuration of the connector of FIG. 3.

FIG. 4 is a view of a connector in accordance with the principles of this invention for interconnecting discrete wires. FIG. 4A is a view of the assembled configuration of the connector of FIG. 4.

FIG. 6 is a view of a connector in accordance with the principles of this invention for separately interconnecting corresponding conductors in flat cables in which the conductors have different cross sections.

DETAILED DESCRIPTION OF THE PREFERRED EMBODIMENTS

Figure 1:
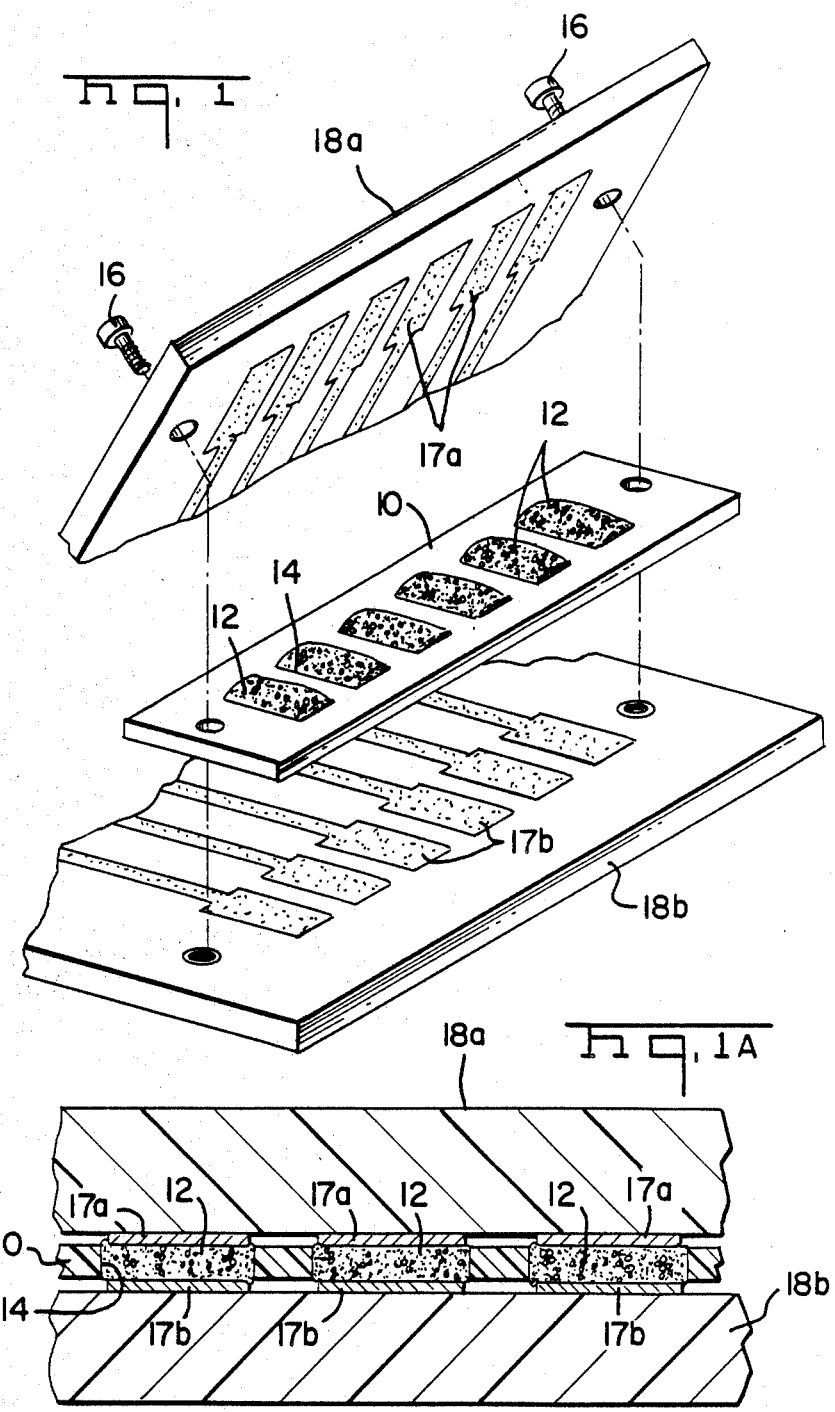
FIG. 1 is an exploded view of a connector in accordance with the principles of this invention for interconnecting parallel printed circuit boards.

The conductive gel employed as the preferred embodiment of this invention comprises a polymerizable gel-like material. The conductive gel is formed by dispersing a plurality of conductive particles within a gelatinous dielectric medium. In order to form a fully conductive gel, the concentration of the conductive particles in the dielectric medium must be at least equal to or above the percolation threshold. The percolation threshold is the lower limit of the volumetric concentration of randomly distributed conductive particles within a dielectric medium which would result in bulk conductivity. The conductivity threshold is generally on the order of 20 to 25% by volume of conductive particles in a dielectric medium. In the preferred embodiment of this invention, concentrations of between 25 and 30% by volume would be employed. It should be understood, however, that anisotropic, or unidirectional conductivity could be achieved in thin films by limiting the concentration of the conductive particles to the order of about 10% by volume. Conductivity normal to the plane of the gel at discrete locations could also be achieved by localized disposition of conductive particles within the gel.

Significant properties of this conductive gel are attributable to the dielectric medium employed. This dielectric redium must be selected such that the conductive gel will exhibit a certain memory-like viscosity such that it will accept numerous intermating geometric forms and will conform to the surface area of the conductors to be intermated. The dielectric gel should also tend to self-heal, or return to its original shape, when the conductors are removed. In other words, the conductive gel must be conformable to the interface between the connector and the electrical conductors while the conductors are interconnected, but must return to its original shape after removal of the conductors. This latter characteristic implicitly requires the gelatinous dielectric medium to form a coherent nonflowable mass and then exhibit greater coherence than adhesion to the extraneous conductors mated therewith. In other words, the conductive gel should not stick to the conductors upon disengagement.

Certain silicone gels exhibit the physical characteristics for use in the invention described herein. One such silicone gel, comprising the preferred embodiment of this invention, is a dielectric two-component transparent silicone encapsulant specifically designed to seal, protect, and preserve the electrical characteristics of electrical components embedded therein and marketed under the trademark Sylgard 527 by Dow Corning Corporation. Sylgard is a registered trademark of Dow Corning Corporation. When the two components of this material are mixed in a one-to-one ratio, the consequent cured material forms a cushioning, self-healing, resilient gel-like mass. This gel has some of the stress relief and self-healing properties of a liquid but is dimensionally stable and nonflowing. In other words, the gel is characterized by the absence of substantial shear stresses. This gel is resilient and exhibits some of the characteristics of a solid elastomer. The material is hydrophobic and forms a seal with the electrical conductors inserted therein. This material is deformable and will conform to the contours of a housing cavity in which it is deposited as well as conforming to the interface with conductors inserted into engagement therewith. Thus, this gel will allow insertion of discrete components such as wires into the gel and will also conform to a flat surface such as the traces on the surface of a printed circuit board or other substrate.

Figure 7:
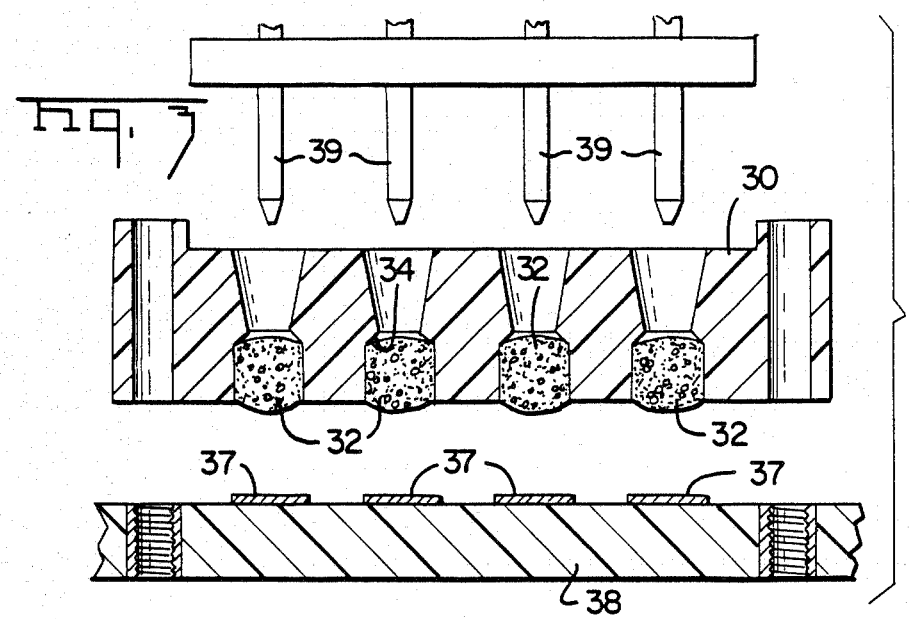
FIG. 7 is a view of the conductive gel located within the cavity of a housing.
Figure 7A:
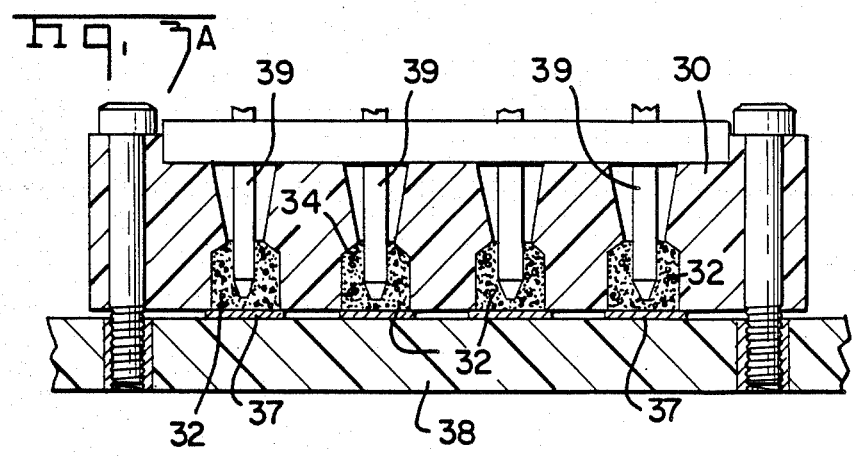
Figure 7:
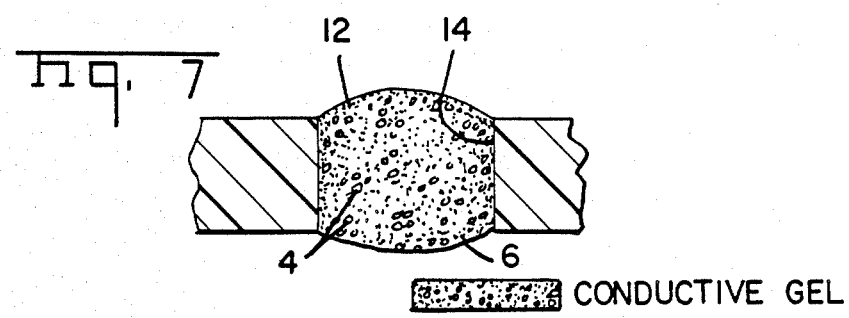

The conductive particles 4 distributed within the gelatinous medium 6 to form a conductive gel as shown in FIG. 7 can comprise any of a number of conventionally available conductive particles. For example, silver-coated nickel particles or silver-coated glass particles could each be advantageously employed in the preferred embodiment of this invention. Solid silver spheres or silver flakes might also be employed.

FIGS. 1-6 show several illustrative embodiments of electrical connector apparatus employing the conductive gel described above in accordance with this invention. It should be understood that these examples are illustrative only, and the interconnection of numerous other conventional electrical components could be made in accordance with the principles of this invention. FIG. 1 depicts the manner in which a connector of this type could be employed to interconnect conductive traces 17a and 17b located on printed circuit boards 18a and 18b respectively. An insulative body 10 having a plurality of open-ended cavities 14 spaced apart such that the cavities can be positioned in registry with the conductive traces 17a and 17b is used to form a simple disconnectable interconnection. The conductive gel 12 is disposed within the respective open-ended cavities 14. Since cavities 14 open on the tcp and bottom surfaces of the insulative body 10, the conductive material is disposed to form an electrical interface with traces 17a and 17b located both above and below the insulative housing 10. A conventional hold down means 16 is employed to secure the dielectric body 10 to both printed circuit board substrates 18a and 18b.

Prior to assembly, the conductive gel 12 conforms to the contours of the cavity 12 and has sufficient viscosity such that the conductive gel is nonflowable and will remain in cavities 14. When the body 10 is brought into engagement with the surface of the printed circuit boards 18a and 18b, the conductive gel 12 conforms to the interface with traces 17a and 17b. The hold-down 16 holds the cavities and the conductive gel in registry with the appropriate printed circuit board traces. When this connector is disconnected, the self-healing dielectric gel retains its shape and remains within the cavities of the housing and does not adhere to the traces 17a and 17b, thus permitting withdrawal of the printed circuit boards and re-use of the conductive gel connector. Thus, associated conductor 17a and 17b can be interconnected with associated traces being in mutual registration with the open-ended cavities 14 and the conductive gel 12 contained therein.

Figure 2:
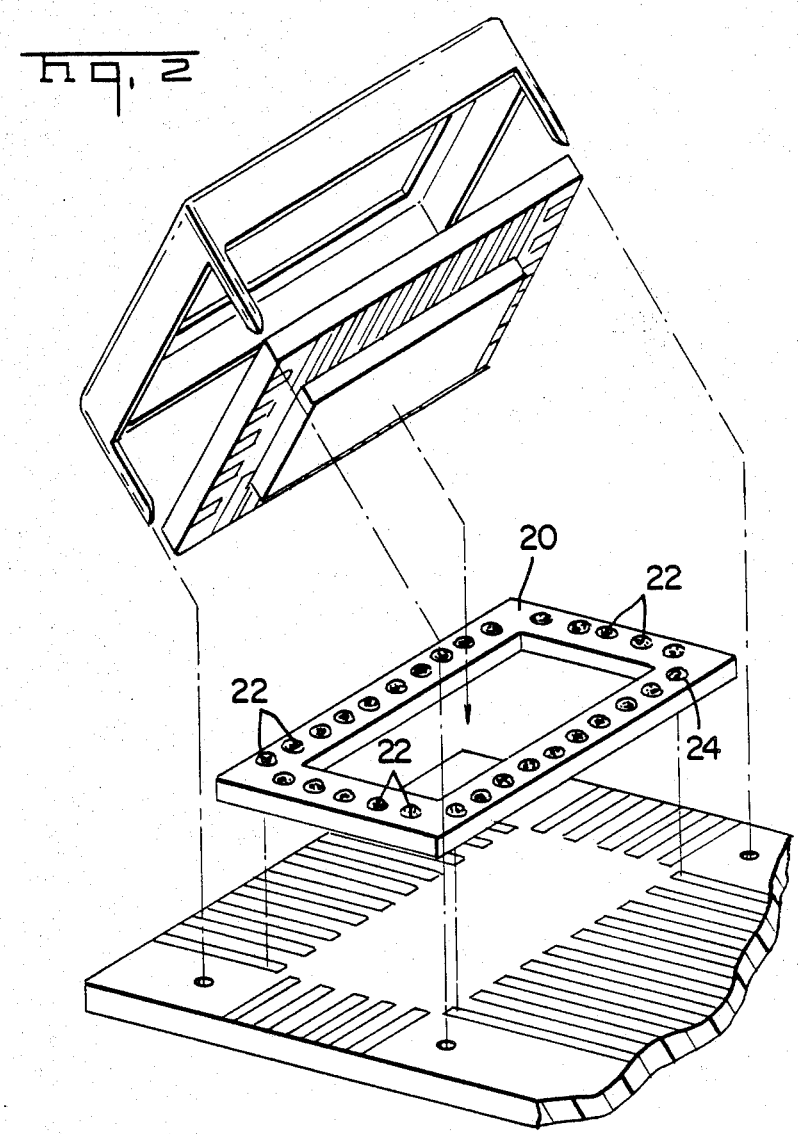
FIG. 2 is a view of a connector in accordance with the principles of this invention for interconnecting a flat panel display to a printed circuit board.
Figure 2A:
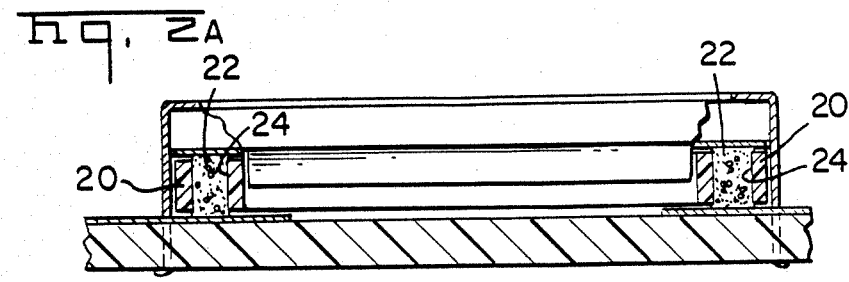
FIG. 2A is a view of the assembled configuration of the connector shown in FIG. 2.

FIG. 3 represents another embodiment of this invention in which the conductive gel connector is employed to interconnect traces on a flat panel display to a printed circuit board. Again, the connector consists of an insulative body 20 having a plurality of cavities 24 in which a conductive gel 22 is disposed. As shown in the embodiment of FIG. 2, these cavities 24 can be positioned along all four sides of an open faced housing 20. The conductive gel 22 is positioned such that interconnection can be made between printed circuit board traces and closely spaced fine lines on the flat panel display.

FIGS. 3 and 3A disclose still another embodiment of this invention in which the conductive gel 32 is disposed within cavities 34 in an insulative body 30. This particular connector is adapted to form an interconnection between printed circuit board traces 34 on printed circuit board 38 with pins 39 located in a rectangular array. The conductive gel forms an interconnection with the printed circuit board traces 37 and the pins 39 can be inserted not only into the cavities 34, but also into the gel 32. When the connector is disconnected, the pins 39 can be easily withdrawn from the gel, and the gel will not adhere to the surface of the pins.

FIGS. 4 and 4A disclose an alternative embodiment of this invention in which the conductive gel is employed to form an interconnection with a pair of discrete round wire conductors. As shown in FIG. 2, a metallic sleeve 48 is positioned between an outer heat shrink envelope or body 42 formed of a heat shrink material and the interconductive gel 44. This connector forms a splice between two conductors C. The metallic sleeve 48, which can be either split or cylindrical continuous includes an inner stop 49 in the form of a dimple stamped into the surface of a tubular member. This stop 49 serves to position the two conductors C such that the stripped ends of the conductors will be disposed within the viscous bulk conductive gel 44. Barbs 49 struck inwardly into the metallic sleeve 48 engage the insulation to provide strain relief and additionally to help maintain the conductors C within the conductive gel 44. Barbs 47 provide additional strain relief after the application of heat to the heat shrink tubing 42. Additional conductor securement is provided by the use of fusable sealing inserts 106 located at the exterior of the metallic sleeve 48. It should be understood that this splice connector will form a permanent interconnection between the conductors, and the embodiment of FIGS. 4 and 4A would not provide the disconnectable features inherent in the configurations of FIGS. 1–3. It should be noted, however, that disconnectable splice connectors employing the principles of this invention could be fabricated. Thus, this invention is adaptable for use in making permanent interconnection with associated conductors or to provide a disconnectable electrical conductor to discrete components or closely spaced components located on a substrate.

Figure 5:
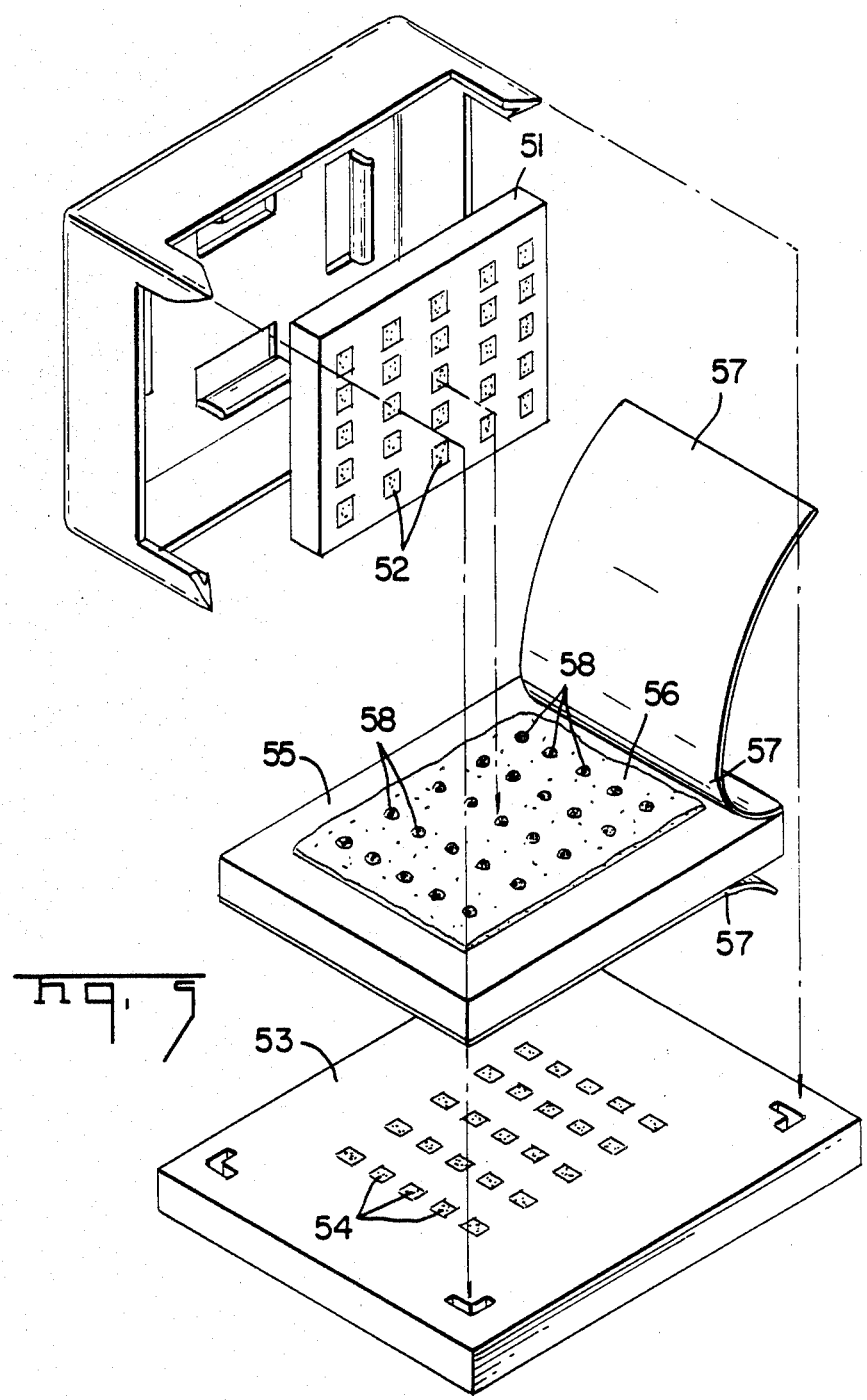
FIG. 5 is a view of a connector in accordance with the principles of the invention for surface mounting a pad grid array on a semiconductor device to a pad grid on a substrate.
Figure 5A:
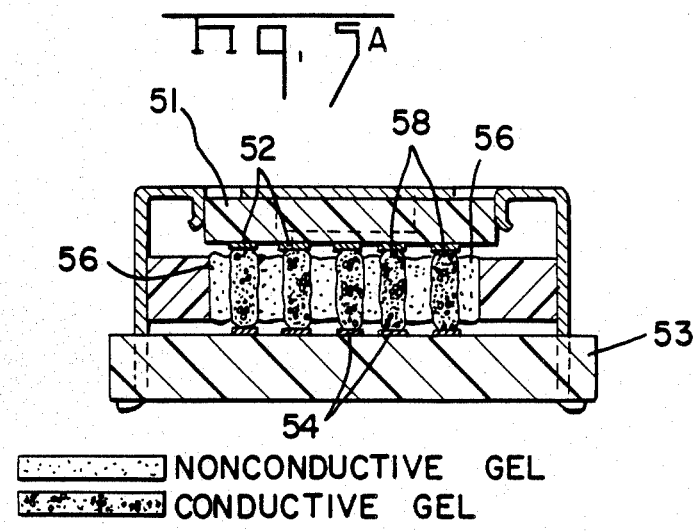
FIG. 5A is a view of the assembled configuration of the connector shown in FIG. 3.

FIG. 5 shows another embodiment of this invention in which a pad grid array semiconductor device can be electrically interconnected to a generally rectangular matrix of pads on a substrate. A conductive gel is used to establish these interconnections. The pad grid array semiconductor device 51 has a plurality of conductive pads 52 disposed in a rectangular matrix on one surface. Individual electrical connections must be made to each of these individual pads 52. For example, electrical interconnection must be made between individual pads 52 and corresponding pads 54 located on the surface of a substrate 53 in a similar rectangular matrix. A conductive gel comprising an insulative matrix 56 having a plurality of conductive centers 58, each containing a plurality of individual electrically conductive particles can be used to establish this interconnection. As shown in FIG. 5, these conductive centers 58 are distributed within the gelatinous medium 56 in a rectangular matrix corresponding to the matrix formed by pads 52 and by pads 54. Note that conductivity normal to the plane of the gel will be established only at the discrete locations in the matrix where conductive centers 58 are located. Lateral conduction through the gelatinous medium 56 would not occur due to the absence of electrically conductive particles between the conductive centers 58. Thus, the conductive gel can be disposed within a single cavity defined within the housing frame 55. The dimensional integrity of the conductive gel will prevent movement of the conductive centers 58, thus permitting individual conductive centers 58 to be aligned between corresponding pads 52 and 54. Release liners 57 on each side of the conductive assembly can be employed to avoid disturbance of the gel prior to use. As shown in FIG. 5A, the semiconductor device containing pads 52 can be clamped to the housing frame 55 which can in turn be clamped to the substrate 53 to form an interconnection between pads 52 and 54. Since the conductive gel does not form a permanent bonded interconnection between the semiconductor device 51 and the substrate 53, the semiconductor device can be removed and the conductive gel either removed by removal of frame 55 or merely wiped off of the substrate and the bottom surface of semiconductor device 51. This permits easy repair and reassembly of pad grid array semiconductor devices. Conventional methods of interconnecting pad grid array semiconductor devices to substrates have proven difficult to implement. For example, a conventional soldered surface mount configuration does not permit inspection of the individual solder joints. Thus, bridged interconnections and opens can result, leading to a difficult repair and reassembly operation. Conventional soldered interconnections also require the application of heat which can result in significant damage. For example, many pad grid array devices comprise VLSI chips which can be damaged by the application of heat during a surface mount solder operation. The use of conductive gel in the manner described herein eliminates these problems and permits interconnection between corresponding pads on closely spaced centerlines.

Figure 6A:
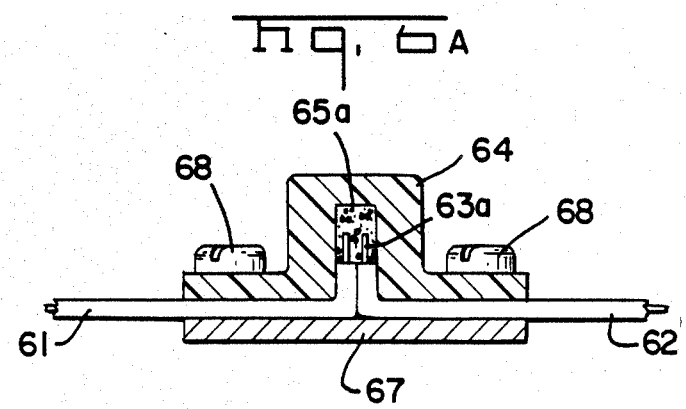
FIG. 6A is a view of the assembled configuration of the connector shown in FIG. 6.

An embodiment of this invention suitable to flat cable 61 and 62 as shown in FIG. 6. The flat cable 61 and 62 contain a plurality of conductors 63a through 63e of various cross sections. For example, conductors 63a and 63e have a rectangular cross section, whereas round wire conductors 63b and 63d have a larger cross section than the round signal conductor 63c. The connection of such cables having different cross sections by conventional means normally requires specific splicing members specifically adapted for each conductor. For example, the flat conductors 63a and 63e might require a crimped interconnection, whereas the round conductors 63b, 63c, and 63d might be connected using an insulation displacement or a wire in slot type interconnection. However, the requirement for different interconnection techniques would prevent mass termination of the flat cable. For instance, the crimping forces for flat conductors 63a and 63e might be inconsistent with the insertion forces required to establish a proper connection between round conductors 63b, 63c, and 63d. Use of a conductive gel in accordance with the principals of this invention simplifies splicing associated conductors since the interconnection is geometry independent. The housing 64 shown in FIG. 6 has a plurality of cavities 63a through 63e, each of which contains a conductive gel 66 similar to that employed in the other embodiments of this invention. By inserting corresponding conductors in each cable 61 and 62 into the same cavity, interconnection between the corresponding conductors would be established through the conductive gel. As shown in FIG. 6A, the housing 64 can be secured to a base plate 67 by means of convention hold-down apparatus such as screw 68. With the flat cable 61 and 62 positioned between the base 67 and the housing 64 and with the ends of the flat cable 61 and 62 both stripped and bent in the manner shown in FIG. 6, the conductive gel deposited within the cavities of housing 64 can establish electrical interconnection in accordance with the principals of this invention. Inasmuch as the numerous embodiment set forth herein each employ a conductive gel in the same manner, it is submitted that one skilled in the art could use the same principals in similar interconnection devices. Therefore, the invention should not be limited to the specific embodiments depicted and described herein.

I claim:

1. An electrical connector for establishing an electrical interconnection between a plurality of associated conductors, the connector comprising:
    an insulative body having open-ended cavity means corresponding to electrical connectors to be interconnected;
    means for holding associated conductors to be interconnected in registration with corresponding cavity means; and
    a conductive gel located within the cavity means, the conductive gel, containing conductive particles and comprising a non-flowable, self-healing resilient gel-like mass having stress relief and self-healing properties characteristic of a viscous liquid being conformable to the cavity means before and after registration of associated conductors with the cavity means and being conformable to the interface between the cavity means and assoicated electrical conductors upon mutual registration thereof, whereby the associated electrical conductors are interconnected through the gel.

2. The electrical connector of claim 1 wherein the conductive gel comprises a plurality of conductive particles dispersed within a gelatinous dielectric medium, the concentration of the particles within the dielectric medium being sufficient to render the gel conductive.

3. The electrical connector of claim 2 wherein the concentration of the conductive particles in the dielectric medium is above the percolation threshold.

4. The electrical connector of claim 2 wherein the conductors are disconnectable from the connector.

5. The electrical connector of claim 3 wherein the gel comprises a nonadhesive coherent mass, the mass being deformable upon engagement with the conductors therewith, the mass returning to the contours of the cavity means after withdrawal of the conductors without adherence to the conductors upon withdrawal thereof.

6. The electrical connector of claim 5 wherein the gelatinous dielectric medium comprises a silicone dielectric gel forming a self-healing, resilient gel-like mass.

7. An electrical connector for establishing an electrical interconnection between a plurality of associated conductors, the connector comprising:
    an insulative body having at least one cavity means, each cavity means being open on at least one side of the body;
    means for securing the conductors relative to the body;
    a conductive gel located within the cavity means, and comprising a plurality of conductive particles dispersed within a gelatinous dielectric medium comprising a non-flowable, self-healing, resilient gel-like mass having stress relief and self-healing properties characteristic of a viscous liquid, the concentration of the particles within the dielectric being sufficient to render the gel conductive, the gel being deformable upon engagement with the conductors without adherence thereto upon withdrawal from engagement, whereby associated electrical conductors are interconnected through the gel.

8. The electrical connector of claim 7 wherein the conductive particles are dispersed within discrete conductive centers within the gelatinous dielectric medium, each discrete conductive center being electrically isolated from other discrete conductive centers.

9. The electrical connector of claim 7 wherein the conductive particles are dispersed throughout the gelatinous dielectric medium, the body having a plurality of cavities, the conductive gel within each cavity establishing electrical interconnection between two associated conductors in registry with a single cavity.

* * * * *